US008172923B2

(12) United States Patent  
Vroman et al.

(10) Patent No.: US 8,172,923 B2
(45) Date of Patent: May 8, 2012

(54) APPARATUS AND METHOD FOR REDUCING PARTICLE CONTAMINATION IN A VACUUM CHAMBER

(75) Inventors: Christopher Vroman, Shrewsbury, MA (US); Marshall Randolph, Wellesley, MA (US)

(73) Assignee: Entegris, Inc., Billerica, MA (US)

( * ) Notice: Subject to any disclaimer, the term of this patent is extended or adjusted under 35 U.S.C. 154(b) by 366 days.

(21) Appl. No.: 12/356,818

(22) Filed: Jan. 21, 2009

(65) Prior Publication Data

US 2009/0183630 A1 Jul. 23, 2009

Related U.S. Application Data

(60) Provisional application No. 61/011,407, filed on Jan. 17, 2008.

(51) Int. Cl.
*B01D 53/22* (2006.01)
*B01D 39/20* (2006.01)
*B01D 46/10* (2006.01)

(52) U.S. Cl. ........... 95/45; 95/273; 95/285; 96/4; 96/11; 55/385.4; 55/487; 55/523; 55/524; 118/715; 137/624.18

(58) Field of Classification Search ............ 96/4, 8, 96/10, 11; 95/45, 273, 285; 55/385.1, 385.2, 55/385.4, 487, 523, 524; 118/715; 137/624.18
See application file for complete search history.

(56) References Cited

U.S. PATENT DOCUMENTS

| 4,739,787 | A  | * | 4/1988 | Stoltenberg | 137/14 |
| 5,908,662 | A  |   | 6/1999 | Fu | |
| 5,993,502 | A  | * | 11/1999 | Motoki et al. | 55/487 |
| 6,506,255 | B2 | * | 1/2003 | Kim | 118/715 |
| 7,112,237 | B2 | * | 9/2006 | Zeller et al. | 95/273 |
| 7,256,370 | B2 | * | 8/2007 | Guiver | 118/725 |
| 2004/0083588 | A1 |  | 5/2004 | Park | |

OTHER PUBLICATIONS

"Optimizing Vacuum Chamber Vent up: An Applications Guide for Diffusers", Wheeler, Robert et al., pp. 1-5, 2005-2008.*
"Chambergard Fast Vent Diffusers", Entegris, Inc., pp. 1-8, 1996-2006.*
Robert Wheeler, et al, Optimizing Vacuum Chamber Vent up: An Applications Guide for Diffusers, Mykrolis Applications Note AN1501ENUS, printed Feb. 2000, copyright 2001 Mykrolis Corporation.

* cited by examiner

*Primary Examiner* — Jason M Greene
(74) *Attorney, Agent, or Firm* — John E. Pillion

(57) ABSTRACT

An apparatus and method for maintaining low gas velocity variation across a diffuser membrane during the vent-up of a vacuum chamber is disclosed. The diffuser membrane permeability and the pressure conditions across the membrane are chosen to minimize variation in gas flow velocity through the membrane during the vent-up cycle. This reduces redistribution of particles from a vacuum chamber onto sensitive substrates in the vacuum chamber during vent-up from sub-atmospheric pressure to atmospheric pressure.

8 Claims, 2 Drawing Sheets

APPARATUS AND METHOD FOR REDUCING PARTICLE CONTAMINATION IN A VACUUM CHAMBER

CROSS REFERENCE TO RELATED APPLICATIONS

This application claims the benefit of U.S. Provisional Application No. 61/011,407, filed Jan. 17, 2008 which is incorporated by reference in its entirety into the present application.

BACKGROUND

Wafer throughput and particle counts are key metrics for any semiconductor manufacturer's yield enhancement program. Recent advancements in diffuser technology have helped manufacturers enhance these metrics while improving the attributes for most vacuum processes. These processes include dry etch, chemical vapor deposition (CVD), physical vapor deposition (PVD), rapid thermal processing (RTP) and Epitaxial deposition (Epi).

The use of membrane diffuser technology for the vent-up of vacuum chambers has dramatically decreased the required vent time compared to a chamber soft vent without a diffuser. An early implementation of this technology was used on 200 mm batch-style loadlocks that had an inherently large internal volume. The loadlock was prone to long vent cycles to prevent particle contamination.

As the industry transitioned to a 300 mm wafer platform, factories increased their development of single-wafer loadlocks (SWLL) in an effort to boost tool throughput. Gas diffusers with ultra fine filtration membranes solved these issues. Compared to the 200 mm batch-style loadlocks, the SWLLs had extremely low internal volumes and were designed to cycle vacuum to atmosphere very quickly. With the low volumes inherent in the SWLL, the velocity of the incoming vent gas became critical, since any particles on the bottom of the loadlock chamber would easily sweep onto the wafer should they be hit with a high velocity gas. Particles are typically present in the loadlock due to mechanical wafer handling devices and environmental exposure. Gas diffusers allowed a large, uniform volumetric flowrate of gas into the loadlock chamber at low downstream gas velocities.

Loadlocks or other chambers may use membrane diffusers, a screen, frit and/or soft vent procedure to control the flow into the chamber to reduce particle counts while maintaining throughput levels at a low cost with minimal downtime. However, while these membrane diffusers, screen or frit can distribute gas in the chamber, they are relatively open and provide little resistance to gas flow into the chamber.

One method used to control particle disturbance in semiconductor vacuum process tool platforms is a two-step venting process, which implements a "soft" vent followed by a standard vent. The soft vent is typically conducted using a second line equipped with a flow restrictor to minimize the flowrate and bleed gas into the chamber until a certain pressure is reached inside the loadlock. This helps reduce the disturbance of particles. Once a set pressure is reached in the loadlock, a second valve is actuated to complete the venting process and bring the pressure of the loadlock to atmosphere. Depending on the volume of the loadlock chamber, the soft vent stage alone can take anywhere from a few seconds to several minutes to complete.

This method can be used where chamber throughput is low. However where tool owners are required to increase wafer throughput due to capacity constraints or to enhance Overall Equipment Effectiveness (OEE) this two-step vent process requires too much time. While many of the critical variables that influence wafer throughput are fixed, (such as the process times, robot speed and loadlock pump down speed) the time to vent up of a chamber or loadlock may become the rate-limiting step to wafer throughput. This is especially true with shorter process times or if dual batch loadlocks are not working in parallel. One approach is to provide a rapid pressure increase by boosting the flowrate of gas. However, with a standard screen or open porous material like a frit, the gas velocity at the chamber entrance will be high and non-uniform, resulting in the disturbance of unwanted particles that have settled in the chamber.

The situation also occurs where vent up time is not a throughput limiting step. In this case, the tool owner is faced with more stringent particle requirements or observes a spike in particles on the wafers in the loadlock. The focus then becomes yield enhancement and the goal is to reduce the particle adders on the wafers. Common approaches to the particle problem on installed system loadlocks have included complete loader rebuilds, performing additional series of wet cleans, upstream filter replacements and screen diffuser replacements, which often do not yield the desired goal.

Membrane diffuser technology allows a rapid but controlled vent up of loadlocks, cool down, transfer and process chambers from vacuum to atmospheric pressure while protecting the wafer integrity. For example, this technology has reduced vent times on a variety of 200 mm vacuum process tool platforms by an average of 65 percent and significantly reduced particle adders—all by maximizing the volumetric flow and minimizing the velocity of ultra pure gas.

Diffuser products are designed using fine porous media, which uniformly spreads the gas flow across a large area, resulting in lower velocities at the chamber entrance. The porous media also serves as a particle filter, removing particles down to 0.003 µm from the incoming gas at high volumetric flows. The result is ultra-clean, diffused gas delivered to the process chamber, which minimizes on-wafer defects.

A membrane diffuser allows the duration of the soft vent to be significantly reduced or even eliminated, and increases the volumetric flowrate into the loadlock to dramatically reduce the overall vent cycle. It should be noted that the diffuser does not affect the pump down cycle. With a diffuser, the decrease in vent time does not come at the expense of higher gas velocities and particle disturbance as typically seen with screens or coarse porous frits. The membrane media for diffusers previously used was designed to uniformly spread gas flows across a large area relative to a standard gas line, a series of drilled holes, or coarse screens. With these membranes high volumetric flows can be achieved with low uniform gas velocities, however the flow could be turbulent rather than laminar. Laminar flow provides less risk of particle re-distribution in the chamber onto sensitive substrates.

A comparison of different components used to create uniform flow were made from measurements that were taken using an ultrasonic probe in the fluid path exiting the component. The results show how the membrane diffuser is more effective compared to a frit or screen under the same volumetric flow conditions. The result of lower gas velocities is the decrease in particle counts (or adders) to the wafer during a loadlock or chamber vent. Particle results taken on wafers prior to and after installation of the diffuser technology on a chamber or loadlock. The combination of an ultra pure filter and fine membrane gas diffuser allowed this dramatic reduction in particle occurrence.

One of the most difficult questions to answer in chamber and diffuser design is what gas velocities are acceptable during a vent to atmospheric pressure with respect to particle re-entrainment. This is a problem compounded by the various mechanisms that adhere a particle to the surface and the varying sizes and shapes of these particles. This can make it extremely difficult to determine the flow required to lift a particle. In addition, since the fluid flow conditions are dynamic, the boundary layer conditions also are active and contribute additional uncertainty in the fluid force available to lift a particle. Further, to determine optimum venting is a relatively difficult analytical problem to fully solve. Physical geometries are fairly complicated, making Computational Fluid Dynamics (CFD) modeling difficult. Additionally, fluid flow may be present in various flow regimes including molecular flow, viscous flow (both laminar and turbulent) and even as shock wave fronts. Lastly, the size or adhesiveness of settled particles on the floor or walls of a loadlock or chamber make it difficult to determine the exact target for nearby fluid velocities to minimize re-entrainment.

Simplified CFD models can provide a general picture of the fluid flow in a loadlock or chamber leading to the best compromise between short vent time, minimal fluid velocity, physical placement of a diffuser, shape of the diffuser, chamber or loadlock geometry and vent-up parameters (e.g. soft vent use). The controlled permeability of the diffuser membrane can also be used to make the fluid flow uniform across the membrane and offers proper resistance to flow in this configuration. The design engineer controls diffuser location during install, membrane shape and membrane permeability.

Mykrolis Microelectronics Applications Note AN1501ENUS recognizes that vent times can be provided that range from less than 0.2 seconds per liter of chamber volume to 4 seconds per liter depending upon the diffuser and supply pressure. Supply pressures of about 40 psig were reported and maximum inlet pressures with outlet to vacuum of 100 psig or less were reported. It also recognizes that for ultra sensitive applications where the overriding concern is preventing the disturbance and redistribution of particles existing in the chamber that a low face velocity is desired and suggested that large area diffusers or multiple diffusers be used. This takes up chamber space and can be expensive. High pressure differential can damage some of these porous membranes. A membrane and operating conditions to achieve laminar flow during vent up of a chamber from vacuum were not disclosed.

U.S. Pat. No. 5,908,662 discloses a processing system including a vacuum chamber and at least one tube disposed through a wall of the vacuum chamber. A gas diffuser is disposed in said tube, possibly at the end of the tube and/or outside the chamber. The gas diffuser is formed from a porous, possibly metallic, material which includes a plurality of microscopic holes whereby gas entering or leaving the vacuum chamber through the tube has a reduced force compared to if the gas diffuser was not present. A membrane and operating conditions to achieve laminar flow during vent up of a chamber from vacuum were not disclosed.

U.S. Patent Application Pub. No 2004/0083588 discloses a vacuum/purge operation of a loadlock chamber prevents an eddy phenomenon from occurring in the chamber and thereby prevents wafers from being polluted and damaged by particles in the chamber. A vacuum pump for providing the loadlock chamber with vacuum pressure, and a gas supply for providing the chamber with purge gas are connected to the loadlock chamber by an exhaust line and a gas supply line, respectively. At least one control valve is installed in each of the lines. At the time the state of pressure in the loadlock chamber is to be changed, the loadlock chamber is provided with both the vacuum pressure and the purge gas at rates that are inter-dependent to establish a flow of gases towards and into the exhaust line. Then, the supplying of one of the vacuum pressure and the purge gas is gradually reduced and cut off. This method of venting a chamber requires large amounts of gas and control feedback between the vacuum pump and gas source to achieve vacuum/purge operation which is expensive. Large differential pressures may exist across the chamber during vent-up, but a membrane diffuser that minimizes variation in gas velocity is not used or disclosed.

U.S. Pat. No. 7,112,237 is directed to porous composite materials comprised of a porous base material and a powdered nanoparticle material. The porous base material has the powdered nanoparticle material penetrating a portion of the porous base material; the powdered nanoparticle material within the porous base material may be sintered or interbonded by interfusion to form a porous sintered nanoparticle material within the pores and or on the surfaces of the porous base material. Preferably this porous composite material comprises nanometer sized pores throughout the sintered nanoparticle material. The disclosure is also directed to methods of making such composite materials and using them for high surface area catalysts, sensors, in packed bed contaminant removal devices, and as contamination removal membranes for fluids. This membrane utilizes bonding of the fine layer to the housing which can be stressed by the differential pressures across the membrane during a chamber vent.

Others have reported that rapid changes in pressure on the introduction of purge gas into a vacuum or removal of gas from a chamber can result in turbulent flow. This can result in the deposition of particles from the chamber onto substrate surfaces. Reduction in flow turbulence during venting diminishes the chance that chamber particles will be disturbed and deposited onto substrates in the chamber. A membrane and operating conditions to achieve laminar flow and minimal variation in mass flow during vent up of a chamber from vacuum were not disclosed.

Diffuser membranes currently in load lock chambers or other vacuum chambers have been used to reduce gas velocity compared to an orifice plate, open porous frit, or a tube having one or more macroscopic holes. However, these membranes can result in a large variation in gas velocity and/or mass flow through the diffuser membrane during vent-up of the vacuum chamber depending upon the pressure of the gas upstream of the membrane. Current diffuser membranes or screens are designed to be relatively open (large pores or openings) to provide low resistance to gas flow while in some instances providing the particle retention of typical gas filters. The relatively open structure of these diffuser membranes shortens vent-up times and increases processing throughput, it also lowers stress and possible cracking of these membranes which can be caused by repeated vent cycles and the pressure differential across the membrane between the vacuum chamber and vent gas source. These more open membranes, frits, and screens while reducing membrane stress and shortening vent-up time, can lead to large variations in gas mass flow over the vent cycle. When gas velocity or mass flow varies sharply, flow conditions can fluctuate from laminar to turbulent or laminar to transitional flow and the sharp variation in flow can cause the re-distribution of chamber particles onto sensitive substrates in the chamber.

DESCRIPTION

Figure 1:
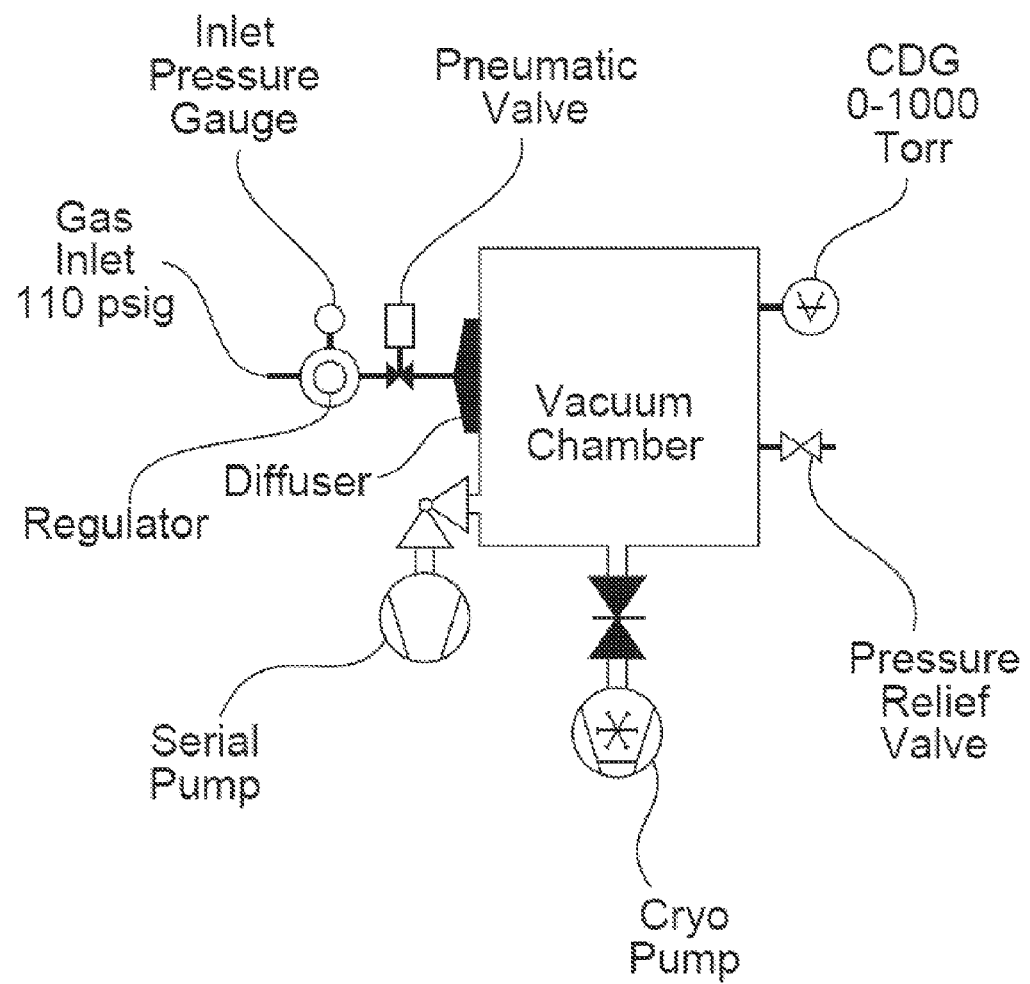
FIG. 1 is an illustration of an apparatus that includes a diffuser membrane and gas diffuser incorporating the diffuser membrane. The apparatus may also be used as a test setup to evaluate diffusers.

While various compositions and methods are described, it is to be understood that this invention is not limited to the particular molecules, compositions, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "diffuser" is a reference to one or more diffusers and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values are herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

Versions of the invention include a diffuser membrane and its use in venting a vacuum chamber or other container at sub-atmospheric pressure up to atmospheric pressure and provides laminar flow and minimizes variation in gas mass flow into the container for as much of the vent cycle as possible. In some versions the variation in gas mass flow with the diffuser membrane is minimized over the time that the diffuser controls gas flow during vent-up into the chamber. Versions of the invention minimize or eliminate the re-distribution of one or more particles in the chamber onto sensitive substrate in the chamber.

The inventors have discovered that restrictive, less open and tighter diffuser membranes, can be used to reduce variation in gas velocity, Reynolds Number, and mass flow into a vacuum chamber during vent-up while maintaining or decreasing the vent time compared to traditional diffuser membranes and screens. This is unexpected because when traditional diffuser membranes are used at higher pressures the vent time is shortened, however significant variations in mass flow can occur which can lead to particle re-distribution in the chamber. The tighter membrane in the diffuser in versions of the invention allow a higher gas pressure upstream of the diffuser to be used which has the unexpected benefit of reducing gas mass flow variation and maintaining or reducing vent-up cycle time.

Versions of the invention can have a diffuser membrane whose permeability and or restriction to gas flow allows a container such as a vacuum chamber at sub-atmospheric pressure to vent-up to atmospheric pressure in the same amount of time as a traditional diffuser and membranes, these traditional or existing diffusers are illustrated for example but not limited to those disclosed in Mykrolis Microelectronics Applications Note AN1501ENUS. The diffuser membranes in versions of the invention allow vent-up to atmospheric pressure with less gas mass flow variability because the inventive diffuser membranes are tighter, can be used at higher inlet pressure, and have the strength to resist stress and cracking at the higher pressure than such traditional diffuser membranes.

When a vacuum chamber or other container at sub-atmospheric pressure, for example but not limited to a loadlock chamber, is to be vented, it starts at high vacuum (very low pressure) and ends at atmospheric pressure (high pressure). Since the Reynold's Number is a direct function of gas velocity and density and they change in opposite direction throughout the vent cycle, the Reynold's Number during the viscous flow portions of the chamber vent will not vary dramatically. The Reynolds Number will be higher in the beginning and lower at the end of the vent as the chamber pressure reaches atmospheric pressure. This is due primarily to the fact that the differential pressure across the diffuser membrane is higher in the beginning of the vent cycle than at the end because the loadlock chamber is at lower pressure in the beginning of the cycle (less than atmospheric pressure) than at the end, whereas the diffuser inlet pressure is essentially constant and at higher pressure (for example the diffuser inlet pressure can be 10 psig or more, in some cases more than 45 psig, in other cases 70 psig or more, and in still other cases 100 psig or more).

To optimize the vent up of a vacuum chamber or container, for example provide laminar flow, reduce gas flow variability, and reduce the re-distribution of one or more particles in a load lock chamber during vent up onto substrates in the chamber, a high differential pressure across the diffuser is established across the diffuser membrane during the vent-up of the chamber. The higher this pressure differential pressure across the diffuser membrane during the vent cycle, the less the gas velocity variation is and the less the mass flow variation of gas is from the beginning of the vent cycle to the end of the vent cycle (atmospheric pressure). In some cases the differential pressure across the diffuser membrane in a vacuum chamber during vent up is more than 20 psid, in some cases 45 psid or more, in some cases 70 psid or more, and in still other cases 100 psid or more. In some cases the variation in gas velocity and or mass flow is sufficiently small during the vent-up of the chamber that laminar flow conditions are maintained in the chamber throughout the vent cycle.

For example, suppose a diffuser inlet pressure of 70 psig in case 1 diffuser and 10 psig in case 2 diffuser and design each diffuser to vent a given loadlock chamber in the same amount of time. The diffuser membrane in case 1 is much "tighter" or restrictive to gas flow than in case 2—the pore size of the case 1 diffuser membrane is smaller or the pore size of the fine layer is smaller in case 1 (the permeability to gas is lower) than the pore size of the diffuser in case 2 (case 2 gas permeability is higher than case 1). The diffuser in case 1 will see a change in differential pressure from approximately 85 psid to 70 psid while the diffuser in case 2 will see a change in differential pressure from approximately 25 psid decreasing to 10 psid from the beginning of the vent cycle to the end.

Mass flow for the case 2 can spike to a relatively higher value at the beginning of the vent up compared to case 1 and mass flow for case 2 will end at a lower relative value compared to case 1 because of the low 10 psig inlet pressure. The spike to relatively higher pressure for case 2 can cause the re-distribution of particles from the chamber onto sensitive substrates in the chamber and may result in turbulent or transitional flow rather than laminar flow. Accordingly the mass flow rate of the diffuser in case 1 varies much less than in case 2 and thus the gas velocity also varies less. This shows that higher diffuser differential is better.

Versions of the invention can be used with disk or tube diffusers. In some cases the diffuser occupies a volume that is substantially that of a disk. Disk shaped diffusers can have better fluid distribution in a chamber than a tube diffuser because the disk diffuser can act as a shower and distribute gas into the chamber in a desired direction. Because disk shaped diffusers have a low profile in the chamber compared to tube shaped diffusers, disk shaped diffusers afford greater flexibility in their placement in the chamber. For example, a disk shaped diffuser can be placed near the center of the chamber and because of its low profile, it will protrude less into the center of the vacuum chamber interior and provide more uniform gas distribution to the chamber as compared to a tube shaped diffuser.

FIG. 1 illustrates a non-limiting version of an apparatus of the invention that includes a diffuser membrane and gas diffuser incorporating the diffuser membrane. The apparatus may also be used as a test setup that may be used to evaluate diffusers. Pressure measurements in the chamber at various points from the diffuser may be made using an ultrasonic probe in the fluid path exiting the diffuser (not shown). The gas velocity in (ft/min) or meters/sec can be measured or calculated and plotted versus the distance from the center of the diffuser. A pneumatic isolation valve and pressure regulator may be located upstream of the diffuser to provide control of the vent up rate, and inlet pressure. By varying the inlet pressure setpoint, the chamber vent up time of the chamber from vacuum (lower pressure) to atmospheric pressure (higher pressure) can be measured and controlled. The system may consist of a 30 Liter or other suitable sized chamber, a dry mechanical scroll pump, and a cryogenic pump. Pressure in the chamber can be monitored with a capacitance diaphragm gauge, Priani, or other suitable pressure or vacuum sensor or combination of these, with a range of 0-1000 torr and a fast response time for example but not limited to about 20 milliseconds or less. A 2 psig or other similar check valve can be used for pressure relief of the chamber. A pneumatic valve can be located upstream of the diffuser and may have a $C_v$ of 0.4 or higher and the regulator used can have a full open $C_v$ of 0.9 or other suitable $C_v$ with a maximum delivery pressure of 100 psig or higher.

In some embodiments of the invention, components like regulator and valve are chosen to minimize piping system losses and conductance losses. In some embodiments the system components upstream of the diffuser are chosen to minimize the variation in mass flow of gas into the vacuum chamber during vent-up. For example the resistance to gas flow of the tubing supplying the gas to the diffuser may be sufficiently small or large and the length chosen to minimize the variation in mass flow of gas into the chamber during vent-up; the components such as the regulator or upstream valve can be chosen to have $C_v$'s that minimize the variation in mass flow of gas into the chamber during vent-up, the permeability or resistance to gas flow of the diffuser membrane can be chosen to minimize the mass flow variation of gas into the vacuum chamber during chamber vent-up, or any combination of these may be used to minimize the mass flow variation of gas into the vacuum chamber during chamber vent-up. In some cases, for example retrofits with restrictive membrane diffusers in place of existing diffusers, the restrictive diffuser membranes in versions of the invention can reduce frictional losses of the gas system components upsteam of the diffuser. This is beneficial for overall process control of the vent-up cycle because the pressure upstream of the restrictive membrane will be closer to the pressure measured and controlled by the up-stream regulator as compared to systems with existing open diffuser membranes.

Figure 2:
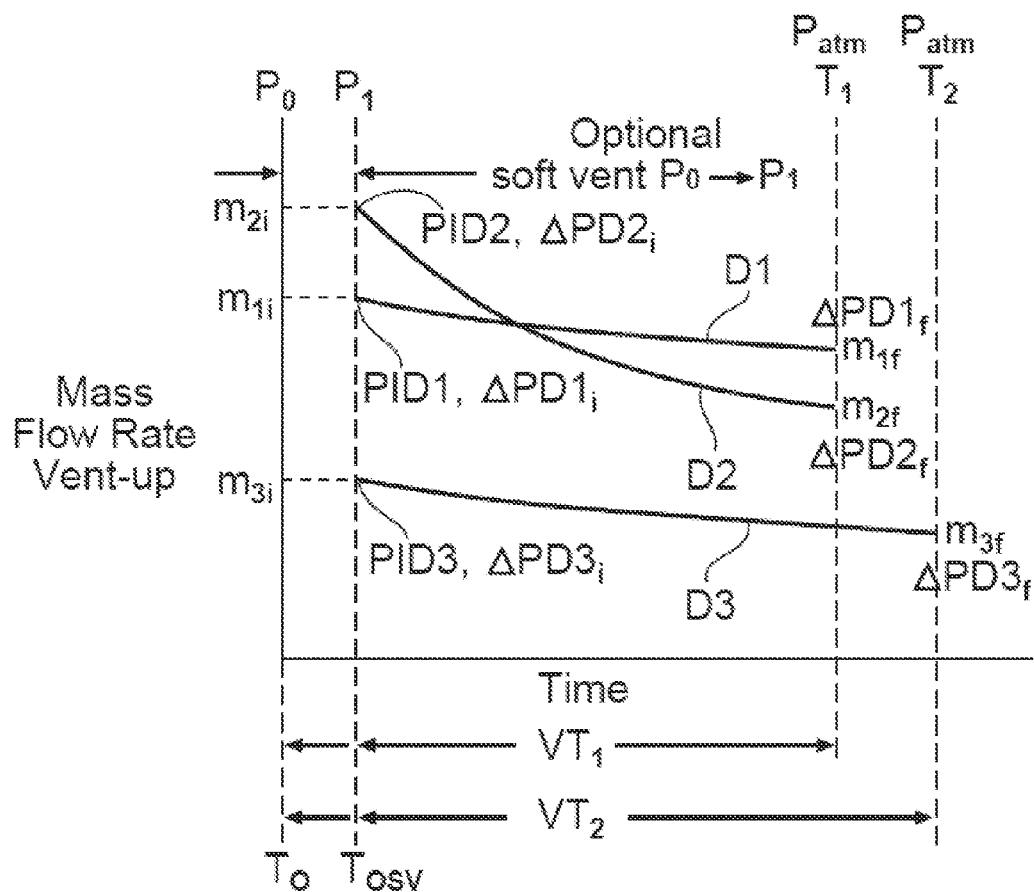
FIG. 2 is a representation of the mass flow of gas into a vacuum chamber from sub-atmospheric pressure $P_0$ to atmospheric $P_{atm}$ during chamber vent-up as a function of time.

FIG. 2 is a non-limiting representation of mass flow of gas into the same vacuum chamber from sub-atmospheric pressure $P_0$ to atmospheric $P_{atm}$ or near atmospheric pressure during chamber vent-up as a function of time or chamber pressure for different diffuser membranes and various diffuser inlet pressure conditions. Although actual mass gas flow curve shape and magnitude may differ from these representations, these gas mass flow curves can be used to illustrate expected relative vent times, variation in gas mass flow, and optional soft vent in versions of the invention. The starting time for the vent-up can be measured from $T_0$, or $T_{0sv}$ if the optional soft vent is used, to a final time $T_1$ or $T_2$. A soft vent can be used to increase the pressure in the chamber from sub-atmospheric pressure $P_0$ to a pressure $P_1$ after which the diffuser can be used to control the chamber vent-up; $P_1$ in some embodiments can be about 10±(1 to about 5) torr.

In FIG. 2, Curve D1 illustrates the mass flow of gas through a diffuser membrane D1 in embodiments of the invention into the chamber initially at sub-atmospheric pressure $P_1$ after an optional soft vent (could also be $P_0$, not shown). The initial mass flow, $m_{1i}$, through the D1 membrane occurs with inlet pressure upstream of the diffuser membrane of PID1; the initial differential pressure across the membrane D1 is $\Delta PD1_i = (PID1 - P_1)$. After a vent-up time, $VT_1$ to a final pressure, for example $P_{atm}$ at time $T_1$, the final mass flow $m_{1f}$ through the membrane occurs with inlet pressure upstream of the diffuser membrane of PID1 and the differential pressure across the membrane D1 is $\Delta PD1_f = (PID1 - P_{atm})$. When the chamber reaches the final pressure, source gas to the upstream side of the diffuser is stopped.

In FIG. 2, Curve D2 illustrates the mass flow of gas through a Diffuser membrane D2 into a chamber where the membrane has less resistance to gas flow than D1. At the beginning of the vent cycle the chamber is initially at sub-atmospheric pressure $P_1$ (could also be $P_0$, not shown if optional soft vent is not used). The initial mass flow, $m_{2i}$, through the membrane occurs with inlet pressure upstream of the diffuser membrane of PID2, and the initial differential pressure across the membrane D2 is $\Delta PD2_i = (PID2 - P_1)$. After a vent-up time $VT_1$ to a final pressure, for example $P_{atm}$ at time $T_1$, the final mass flow $m_{2f}$ through the membrane D2 occurs with inlet pressure upstream of the diffuser membrane of PID2, and the differential pressure across the membrane D2 is $\Delta PD2_f = (PID2 - P_{atm})$. The diffuser membrane D2 is more open and less restrictive to gas flow than diffuser membrane D1, PID2 is less than PID1, $\Delta PD2_i$ is less than $\Delta PD1_i$, and $\Delta PD2_f$ is less than $\Delta PD1_f$. To vent-up this chamber in the same amount of time $VT_1$ using the D1 membrane, the inlet pressure PID1 can be increased over PID2 to achieve the same vent time which as shown results in a lower gas mass flow variation for D1 compared to D2; the difference $(m_{1i} - m_{1f})$ is less than $(m_{2i} - m_{2f})$.

In FIG. 2, Curve D3 illustrates the mass flow of gas through a diffuser membrane D3 into a chamber where the diffuser membrane D3 has the same resistance to gas flow as the D1 diffuser membrane but uses an inlet pressure similar to the case for D2. At the beginning of the vent up cycle using the D3 membrane the chamber is initially at sub-atmospheric pressure $P_1$ (could also be $P_0$, not shown if the optional soft vent is not used). The initial mass flow, $m_{3i}$, through the membrane occurs with inlet pressure upstream of the diffuser membrane of PID3 which is less than PID1, and the initial differential pressure across the membrane D3 is $\Delta PD3_i=(PID3-P_1)$ which is also less than $\Delta PD1_i$. After a vent-up time $VT_2$ (which is greater than $VT_1$) to a final pressure, for example $P_{atm}$ at time $T_2$, the final mass flow $m_{3f}$ through the membrane occurs with inlet pressure upstream of the diffuser membrane of PID3, and the differential pressure across the membrane D3 is $\Delta PD3_f=(PID3-P_{atm})$ which is less than $\Delta PD1_f$. As illustrated the vent-up time using this more restrictive membrane under the same or similar $P_1$ and $P_{atm}$ for D2 results in a longer vent-up time $VT_2$ than for D2 ($VT_1$) but less variation in gas mass flow, the difference $(m_{3i}-m_{3f})$ for D3 is less than $(m_{2i}-m_{2f})$ for D2.

In some versions of the invention the difference between the initial mass flow for a diffuser and the final gas mass flow for the diffuser may be used as all or part of a measure of the variation of gas mass flow into the chamber during vent-up. As shown by the non-limiting representation in FIG. 2, for the same or similar vent times, the difference or variation in gas mass flow rate for the more resistive diffuser membrane D1, $(m_{1i}-m_{1f})$, is less than difference or variation in gas mass flow for the more open diffuser membrane D2 of $(m_{2i}-m_{2f})$. In other words the variation in gas mass flow rate for the more open diffuser membrane D2 is larger than the variation in gas mass flow rate for the more restrictive diffuser membrane D1. The smaller variation in gas mass flow for the more restrictive D1 diffuser membrane compared to the D2 diffuser membrane can reduce or eliminate re-distribution of particles from the chamber onto sensitive substrates in the chamber.

While diffuser membranes like D2 may be capable of being used at higher inlet pressures, because they are more open, utilizing an even higher upstream vent gas pressure than shown for D2 in FIG. 2, for example PID2*(not shown) >PID2, is expected to result in an even higher initial mass flow $m_{2i}$*(not shown)>$m_{2i}$, and an even greater variation in gas mass flow rate over the vent-up cycle. This variation may cause re-distribution of particles in the chamber. Diffuser membranes which are tighter and more restrictive to gas flow than D1 may be used at even higher inlet upstream pressures than PID1, for example PID1*(not shown). This is expected to result in even less variation in gas mass flow for the more restrictive membrane compared to D1.

Embodiments of the invention for venting a vacuum chamber to atmosphere may eliminate a soft vent, shorten the duration of the soft vent, or may be coupled with a soft vent. For Example, as shown in FIG. 2, an optional soft vent from vacuum or reduced pressure $P_0$ to a pressure $P_1$, where at pressures greater than $P_1$ the diffuser controls some or all of the chamber vent gas flow, may be used at the beginning of the chamber vent-up cycle.

Spikes or peaks in mass flow of a gas through a diffuser during the initial vent-up can result from large variations in gas mass flow rate during the chamber vent-up and can re-distribute one or more particles in the chamber onto sensitive substrates in the chamber. The spikes, peaks or large variations in gas mass flow during the vent-up cycle may also cause turbulent or transitional flow conditions rather than laminar flow to exist in the chamber. Minimizing the variation of mass flow into the chamber compared to existing open diffuser membranes, in some cases under laminar flow conditions, can reduce or eliminate the re-distribution of one or more particles in the chamber onto sensitive substrates like semiconductor wafers during the vent-up cycle.

Versions of the invention minimize the variation in mass flow through the diffuser during chamber vent-up from sub-atmospheric pressure to atmospheric pressure or a final chamber pressure above the initial sub-atmospheric pressure. The reduced variation includes reducing the peak mass flow rate or any spike in mass flow rate at the beginning of a vent cycle and or reducing decreases in mass flow through the diffuser as the chamber pressure approaches atmospheric pressure. Minimizing the mass flow rate variation during vent-up can be achieved for example by establishing a high differential pressure for the vent gas, for example greater than 20 psid, 45 psid, 70 psid, or 100 psid, across the diffuser membrane by using a tight or restrictive diffuser membrane with smaller pore size or thicker membrane compared to traditional or existing diffuser membranes (see for example Diffuser membranes described in Table 1, Mykrolis Microelectronics Applications Note AN1501ENUS). In some cases the restrictive diffuser is substantially disk shaped. A high differential pressure across the diffuser membrane allows for faster chamber vent up and combined with the tighter diffuser membrane, allows for reduced variation in gas mass flow during the vacuum chamber vent-up.

The vent time versus inlet pressure upstream of the diffuser membrane can be obtained for the system for diffuser membranes with varying permeability or resistance to gas flow. The chamber can, for example but not limited to, be evacuated to below 10 mTorr with the scroll pump. The scroll isolation valve can be closed and the inlet valve to the diffuser opened. The pressure in the chamber, the inlet pressure upstream of the diffuser measured, and the pressure change with time during vent up of the chamber measured (from opening of the inlet valve to the diffuser to a final pressure, for example but not limited to about 760 torr, or for example atmospheric pressure). The procedure can be performed for various inlet pressures upstream of the diffuser membrane of for example between 3 and over 100 psig. Different gases like Helium, nitrogen, or argon can be used. The mass flow of gas into the chamber and the pressure of the chamber during vent-up can also be measured and plotted and the variation in mass flow rate during the vent-up determined.

The diffuser membranes and methods in versions of the invention may also be characterized by the number of one or more adder particles from a test chamber deposited on test silicon wafers in the chamber during vent-up cycles (vacuum or reduced pressure vented up to about atmospheric pressure or atmospheric pressure) of the test chamber. The particles on the test substrate can be measured by light scattering surface scan or other suitable method. One or more adder particles on wafers from the chamber without a diffuser, with a standard or existing diffuser (for example FV-100D diffuser available from Entegris, formerly Mykrolis), and restrictive diffuser membranes of the present invention can be compared for mass flow variation, adder particles, and vent time under various diffuser inlet pressures and pressure differentials. Diffuser membranes that are more restrictive to gas flow than existing diffuser membranes, and in some cases disk shaped diffuser membranes that are more restrictive to gas flow than existing diffuser membranes, vacuum chambers including them, and methods for using these that provide less mass flow variation during vacuum chamber vent-up are expected to result in fewer adder particles on test wafers than existing diffusers and methods currently in use.

In some cases the methods for minimizing gas flow velocity variation and or gas mass flow variation in versions of the invention, such as by maximizing the pressure differential across the diffuser membrane, may be used with existing traditional diffuser membranes to achieve fewer adder particles on test wafers.

The diffuser membranes in versions of the invention are more restrictive to gas flow than traditional or existing diffuser membranes (see for example comparison to some existing Diffuser membranes described in Table 1, Mykrolis Microelectronics Applications Note AN1501ENUS) because they have smaller pores, a thicker membrane, or any combination of these compared to such traditional or existing diffuser membranes. These more restrictive or less permeable diffuser membranes in versions of the invention can have a uniform pore distribution, a gradient pore size distribution, or be a composite where a dense layer with small size pores is formed on a more open membrane or support layer. In some versions of the invention the porous media has a layered structure with a coarse frit, foam, screen, or membrane with large pores supporting a thin dense membrane layer with smaller pores. The dense layer can be thinner than the support layer. The dense layer can be on the upstream or downstream side of the support, in some cases the dense layer is formed on the upstream side of the diffuser. Forming the dense layer on the upstream side of the support layer allows a portion of the support layer away from the dense layer to be bonded to a housing or other suitable fixture, minimizes bonding defects, and allows the support layer to support the dense layer in the direction of gas flow. The dense layer on the membrane support layer can be formed from sintering of particles of various shapes including but not limited to dendritic particles onto the support layer, or may be made by coated or chemical vapor deposition onto a face of the support to form a dense layer or fine layer that is more restrictive to gas flow than existing diffuser membranes.

The porous membrane of the diffuser can also serves as a particle filter, removing particles of 0.003 µm particles or smaller with 9 LRV from the incoming gas at high volumetric flows of 30 slpm or more, in some cases 60 slpm or more, in other cases 90 slpm or more.

Flow rate across the diffuser membranes at maximum inlet pressure, assuming no restriction at the diffuser entrance can be 100 slpm or more, in some cases 500 slpm or more, in other cases 1000 slpm or more, and in still other cases 1200 slpm or more. The diffuser membrane in versions of the invention has lower pas permeability or greater resistance to gas flow through the porous structure of the membrane compared to traditional diffuser membranes (see for example Diffuser membranes described in Table 1, Mykrolis Microelectronics Applications Note AN1501ENUS). In some cases the diffuser membranes in versions of the invention have a 2× or more, a 3× or more, a 4× or more, or a 5× or more, greater resistance to gas flow than these traditional or existing diffuser membranes. For supported membranes in embodiments of the invention, the higher the resistance of the diffuser membrane to gas flow compared to existing diffuser membranes, the higher the gas pressure that can be used upstream of the membrane and the lower the variation in gas mass flow rate that can be achieved during vent-up of a chamber or container from sub-atmospheric to atmospheric pressure. More restrictive membrane will also be more retentive for particles (particles smaller than 0.003 micron and or retention of 9 LRV or more).

Diffusers can be made from a variety of materials such as metals, polymers, ceramics, or combinations of these. Nickel diffuser membrane have been shown to be effective in a variety of environments, including poly and oxide etch processes where highly corrosive gases are used. Other membrane materials may include but are not limited to various stainless steels, Hastalloy, or Teflon.

In the gas diffuser, the porous media membrane is bonded to a support such as a tube, conduit, housing, chamber wall, suitable fixture, or other channel that provides gas to the membrane, supports and bonds the diffuser membrane, and allows mounting of the diffuser to the chamber or container and permits venting of the chamber to atmosphere. The diffuser may include flanges with knife edges, VCR, VCO and other known features that allow the sealing of the diffuser to a port, conduit, or opening in the chamber. The diffuser can be mounted on the inside, wall, or outside of the chamber. The diffuser bonded to the support, or in some embodiments the diffuser is a disk shaped diffuser, is capable of withstanding differential pressures of 20 psig or more, in some cases 30 psig or more, in other cases 45 psig or more maximum inlet pressure with outlet to vacuum (for example but not limited to 10 milliTorr or less) without cracking or damage of the diffuser membrane or the bond between the membrane and support. The fine layer of the membrane can be opposite the bonding or weld area with the housing. This provides greater strength for the differential pressures utilized in chamber vent cycles.

The diffuser membrane can have any shape and may be bonded to a support that allows the diffuser (membrane and support) to be connected to the chamber or conatiner. In some cases the diffuser can be in the shape of a tube. In other cases the diffuser can be disk shaped. Examples of tube shaped diffusers include the FV-16ST and FV-40ST; examples of disk shaped diffusers include the FV-40D and FV-100D, both available from Entegris, Chaska, Minn. Disk shaped diffusers available such as the FV-40D, FV-50D, FV-75, and FV-100D have maximum inlet pressure with outlet pressure to vacuum of 45 psig, 30 psig, 20 psig, and 35 psig respectively. Embodiments of the present invention utilizing less permeable and more restrictive diffuser membranes than existing or traditional diffuser membranes can have maximum inlet pressure with outlet to vacuum of 20 psig or more, in some cases 45 psig or more, in other cases 70 psig or more, and in still other cases 100 psig or more. In some cases the disk shaped diffusers in versions of the invention are able to withstand such pressures because they have a thin membrane layer of small pore size, in some cases the pore size is 10 microns or less, in other cases 2 microns or less, and in still other cases 0.5 microns or less. Smaller pore size provides greater restriction to gas flow. The dense layer may be deposited or bonded on the upstream surface of a more open (20 microns or more in some cases, 50 microns or more in other cases, and 200 microns or more in still other cases) porous support. The ability of the diffuser to operate at differential pressures without damage, for example greater than 45 psid, permits a reduction in the variation of mass flow as the chamber vents up to atmospheric pressure from sub-atmospheric pressure. With an initial downstream outlet to vacuum, pressures greater than 45 psig upstream of the diffuser membrane, especially pressures of 70 psig or more or 100 psig or more, can reduce or eliminate spikes or peaks in mass flow at the start, during, and end of the vacuum chamber vent-up cycle.

The chamber may be any process chamber or container. For example, the chamber may be a multiwafer processing furnace, a single-wafer process chamber, a load-lock chamber or in general any vacuum chamber. The chamber may include many other features including possibly numerous openings or ports, conduits, sensors, heaters, robotics and the like leading into and/or out of the chamber.

Although the present invention has been described in considerable detail with reference to certain preferred embodiments thereof, other versions are possible. Therefore the spirit and scope of the appended claims should not be limited to the description and the preferred versions contain within this specification.

What is claimed is:

1. A method of venting a chamber at sub-atmospheric pressure to about atmospheric pressure, said method comprising:
   opening an inlet valve to a substantially disk shaped gas diffuser membrane, said inlet valve upstream of said substantially disk shaped gas diffuser membrane, said substantially disk shaped diffuser membrane has a maximum inlet pressure with outlet to vacuum of 100 psi or more, a 9 LRV retention of 0.003 micron particles at volumetric gas flow of 30 slpm, and a flow rate at maximum inlet pressure of about 100 slpm;
   flowing a source gas through said substantially disk shaped gas diffuser membrane into said chamber, said chamber at sub-atmospheric pressure, and establishing a differential pressure of 70 psid or more across said substantially disk shape gas diffuser membrane during flow of said gas source gas through the substantially disk shaped diffuser membrane into said chamber,
   stopping the supply of source gas to said substantially disk shaped gas diffuser membrane when said chamber reaches a final pressure of about atmospheric pressure.

2. A vacuum chamber comprising:
   a chamber and a substantially disk shaped gas diffuser membrane that controls the flow of gas into the chamber; said substantially disk shaped gas diffuser membrane characterized by a maximum differential pressure of 70 psid or more, a maximum flow rate for 9 LRV retention of 0.003 micron particles of about 30 slpm, a maximum inlet pressure with outlet to vacuum of 100 psig or more, and a flow rate at maximum inlet pressure of about 100 slpm.

3. The chamber of claim 2 where the substantially disk shaped gas diffuser membrane comprises a fine layer that has a pore size of 10 microns or less on an upstream side of said substantially disk shaped gas diffuser membrane and an open support layer on a downstream side of said substantially disk shaped diffuser membrane, said substantially disk shaped gas diffuser membrane bonded to a fixture that mounts to the chamber.

4. The method of claim 1 further including a soft vent step.

5. The method of claim 1 where the substantially disk shaped gas diffuser membrane comprises a fine layer that has a pore size of 10 microns or less on an upstream side of said substantially disk shaped gas diffuser membrane and an open support layer on a substantially downstream side of said gas diffuser membrane, said substantially disk shaped gas diffuser membrane bonded to a fixture that mounts to the chamber.

6. The method of claim 1 wherein the gas diffuser membrane is disk shaped.

7. The vacuum chamber of claim 2 wherein the substantially disk shaped gas diffuser membrane is disk shaped.

8. The vacuum chamber of claim 3 wherein the substantially disk shaped gas diffuser membrane is disk shaped.

* * * * *